US009927472B2

(12) United States Patent
Vezina et al.

(10) Patent No.: US 9,927,472 B2
(45) Date of Patent: Mar. 27, 2018

(54) ELECTRICAL PROTECTION SLIDE (71) Applicant: Siemens Canada Limited (72) Inventors: Sebastien Vezina, St-Celestin (CA);
Veronique Desilets, Victoriaville (CA);
Simon Mercier, Becancour (CA);
Andreane D'Arcy-Lepage, Sherbrooke (CA)

(73) Assignee: SIEMENS CANADA LIMITED, Oakville, Ontario (CA)

( * ) Notice: Subject to any disclaimer, the term of this patent is extended or adjusted under 35 U.S.C. 154(b) by 0 days.

(21) Appl. No.: 15/171,659

(22) Filed: Jun. 2, 2016

(65) Prior Publication Data
US 2016/0359303 A1 Dec. 8, 2016

Related U.S. Application Data (60) Provisional application No. 62/170,181, filed on Jun. 3, 2015, provisional application No. 62/170,183, filed on Jun. 3, 2015, provisional application No. 62/170,184, filed on Jun. 3, 2015, provisional application No. 62/170,187, filed on Jun. 3, 2015, provisional application
(Continued)

(51) Int. Cl.
| H02B 1/14 | (2006.01) |
| H02B 1/04 | (2006.01) |
| H02B 1/20 | (2006.01) |
| G01R 22/00 | (2006.01) |
| G01R 22/06 | (2006.01) |
| H02G 3/10 | (2006.01) |

(Continued)

(52) U.S. Cl.
CPC ........... *G01R 22/065* (2013.01); *G01R 22/00* (2013.01); *H02B 1/03* (2013.01); *H02B 1/04* (2013.01); *H02B 1/14* (2013.01); *H02B 1/20* (2013.01); *H02G 3/086* (2013.01); *H02G 3/10* (2013.01); *H02G 3/185* (2013.01); *H02G 3/22* (2013.01); *H02G 5/04* (2013.01); *H05K 5/0004* (2013.01); *H05K 5/0204* (2013.01); *H05K 5/0217* (2013.01); *H05K 5/0239* (2013.01); *H05K 5/04* (2013.01); *H02G 3/081* (2013.01)

(58) Field of Classification Search
CPC ............. H02B 1/03; H02B 1/06; G01R 11/04
See application file for complete search history.

(56) References Cited

U.S. PATENT DOCUMENTS 2,403,132 A * 7/1946 Sparkes ................. G01R 11/04
361/660
3,707,652 A * 12/1972 Coffey ..................... H02B 1/21
361/611
(Continued)

FOREIGN PATENT DOCUMENTS

FR 2917911 A1 * 12/2008 ............. G01R 11/24

Primary Examiner — Robert J Hoffberg (57) ABSTRACT

There is disclosed an electrical protection slide for mounting in an electrical meter center enclosing an electrically conductive component, the electrical meter center having a front. The electrical protection slide comprises a slope portion having a downward slope toward the front of the electrical meter center and a mating portion about the slope portion and being adapted for holding at least a portion of the slope portion within the electrical meter center above the electrically conductive component. The slope portion of the electrical protection slide provides electrical insulation and a mechanical barrier for the electrically conductive component from external elements falling thereon.

18 Claims, 8 Drawing Sheets

Related U.S. Application Data

No. 62/170,188, filed on Jun. 3, 2015, provisional application No. 62/170,190, filed on Jun. 3, 2015, provisional application No. 62/170,192, filed on Jun. 3, 2015.

(51) Int. Cl.

| | | |
|---|---|---|
| *H02G 5/04* | (2006.01) | |
| *H05K 5/00* | (2006.01) | |
| *H05K 5/02* | (2006.01) | |
| *H05K 5/04* | (2006.01) | |
| *H02G 3/18* | (2006.01) | |
| *H02G 3/22* | (2006.01) | |
| *H02B 1/03* | (2006.01) | |
| *H02G 3/08* | (2006.01) | |

(56) References Cited

U.S. PATENT DOCUMENTS

| | | | |
|---|---|---|---|
| 3,707,653 A * | 12/1972 | Coffey | H02B 1/03 174/66 |
| 5,936,834 A | 8/1999 | Polston et al. | |
| 6,421,229 B1 * | 7/2002 | Campbell | H02B 1/28 361/622 |
| 7,239,502 B1 * | 7/2007 | Seff | G01R 11/04 361/624 |
| 7,400,495 B1 * | 7/2008 | Ranta | G01R 11/24 361/660 |
| 7,830,648 B2 | 11/2010 | Strong et al. | |
| 8,223,476 B2 * | 7/2012 | Zhang | H02B 1/03 174/54 |
| 8,243,423 B2 * | 8/2012 | Ranta | G01R 11/02 361/660 |
| 9,124,077 B2 * | 9/2015 | Robinson | H02B 1/03 |
| 9,177,736 B2 * | 11/2015 | Barnas | H01H 9/22 |
| 9,312,665 B2 * | 4/2016 | Robinson | H02B 1/03 |
| 9,478,949 B2 * | 10/2016 | Zhang | H02B 1/03 |
| 2013/0206552 A1 | 8/2013 | Barnas et al. | |
| 2014/0098470 A1 | 4/2014 | Robinson et al. | |
| 2014/0099820 A1 | 4/2014 | Robinson et al. | |
| 2016/0356831 A1 * | 12/2016 | Vezina | G01R 22/065 |

* cited by examiner

ELECTRICAL PROTECTION SLIDE

CROSS-REFERENCE TO RELATED APPLICATIONS

This application claims priority from U.S. provisional patent applications U.S. 62/170,181, U.S. 62/170,183, U.S. 62/170,184, U.S. 62/170,187, U.S. 62/170,188, U.S. 62/170,190 and U.S. 62/170,192, all filed Jun. 3, 2015, the specifications of which are hereby incorporated herein by reference in their entirety.

BACKGROUND (a) Field

The subject matter disclosed generally relates to electrical meter centers. More particularly, the subject matter relates to protection of electrical breakers undesired contact with external conductive elements used in the maintenance or assembly of electrical meter centers.

(b) Related Prior Art

There exists, in the electrical metering technology, commercial electrical meter centers, or meter stacks, for commercial and industrial industries, such as, without limitation, shopping centers, industrial buildings, condos, warehouses, oil and gas industries, and the like.

For maintenance and/or new installation purposes, customers, installers and/or repairmen are supposed to shut down the electrical power of the entire electrical meter center before installing a new electrical breaker (i.e., with line and load sides powered plated bus bars) or before repairing an existing one. However, for many reasons, and in many circumstances, customers, installers and/or repairmen cannot afford to perform such an operation. For example, it would not be time and cost efficient to shut down the electrical power of a bank implanted in a commercial center to install a new electrical breaker for a new pet shop adjacent that bank in the shopping center.

Thus, customers, installers and/or repairmen are frequently performing these tasks without shutting down the electrical power. Therefore, for example, when an installer wants to install a new electrical breaker above an existent electrical breaker in an electrical meter center, he needs to screw and unscrew one or more screw(s), and the odds are that screws may fall down and touch one or more of the three or more phases of the bus bars exiting from the top of that previously installed electrical breaker (load side). This presents high chances of creating short-circuits between two or more polarity powered parts (phase A, B, C, neutral or ground), thus resulting in damaging one or more electrical breaker(s), in damaging the entire electrical meter center and/or in injuring the customer, installer or repairmen.

There is therefore a need for an improved electrical protection for protecting electrical breakers and plated copper or aluminum bus bars from contact with external conductive (or non-conductive) elements, such as screws falling from above.

Even if the above example is directed to an electrical breaker protection for protecting electrical breakers and plated bus bars from contact with external conductive element, it is to be mentioned that there is also a need for protecting, in general, air insulated powered equipment from contact with external conductive elements, which are not necessarily parts belonging to electrical meter centers.

SUMMARY

According to an embodiment, there is provided an electrical protection slide for mounting in an electrical meter center enclosing an electrically conductive component, the electrical meter center having a front. The electrical protection slide comprises a slope portion having a downward slope toward the front of the electrical meter center, a mating portion about the slope portion and being adapted for holding at least a portion of the slope portion within the electrical meter center above the electrically conductive component, wherein at least the slope portion of the electrical protection slide provides electrical insulation and a mechanical barrier for the electrically conductive component from external elements falling thereon.

According to an aspect, the slope portion defines a substantially flat surface.

According to an aspect, the slope portion defines an angle of about between 15 and 65 degrees relative to a horizontal plane when mounted in the electrical meter center.

According to an aspect, the slope portion is made of or covered with an electrically insulating material.

According to an aspect, a thickness of the slope portion is between 0.005 inches and 0.125 inches.

According to an aspect, the mating portion further comprises an abutment face adapted for abutting against the electrical meter center.

According to an aspect, at least the slope portion is made of a substantially flexible material.

According to an aspect, the electrical protection slide further comprises a lip projecting downwardly from the slope portion.

According to an aspect, the electrical protection slide further comprises a fold and a back surface extending from the slope portion along the fold.

According to an aspect, the mating portion, the back surface and the slope portion are made from a single unitary piece of material.

According to an embodiment, there is provided an assembly adapted for mounting in an electrical meter center having a front and enclosing an electrical breaker. The assembly comprises an electrical protection slide adapted for installation within the electrical meter center above the electrical breaker and comprising a slope portion having a downward slope toward the front of the electrical meter center, the electrical protection slide providing electrical insulation and a mechanical barrier for the electrical breaker from external elements falling thereon.

According to an aspect, the assembly further comprises a bus insulator comprising a protective body extending rearwardly from the slope portion, wherein the protective body provides electrical insulation and a mechanical barrier for the electrical breaker from the external elements falling thereon.

According to an aspect, the slope portion comprises a slit and the bus insulator comprises a slot cooperating with the slit for assembling electrical protection slide to the bus insulator.

According to an aspect, electrical protection slide further comprises a fold and a back surface extending from the slope portion along the fold.

According to an aspect, the back surface comprises a hole and the bus insulator also comprises a hole, wherein assembly further comprises a fastener cooperating with the hole in the bus insulator and the hole in the back surface to fasten the electrical protection slide to the bus insulator.

According to an embodiment, there is provided an electrical meter center having a front and comprising an electrical breaker installed within the electrical meter center; an electrical protection slide installed within the electrical meter center above the electrical breaker and comprising a slope portion having a downward slope toward the front of the electrical meter center, the electrical protection slide providing electrical insulation and a mechanical barrier for the electrical breaker from external elements falling thereon.

According to an aspect, the electrical meter center further comprises a frame, and wherein the electrical protection slide further comprises a mating portion adapted to cooperate with the frame to hold the electrical protection slide into position.

According to an aspect, the electrical meter center further comprises an electrical bus bar connected to the electrical breaker, and wherein the electrical protection slide further comprises a bus insulator extending from the slope portion and providing electrical insulation and a mechanical barrier for the electrical bus bar from the external elements falling thereon.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

In embodiments, there are disclosed electrical breaker (or equipment) protection slides for protecting electrical breakers and powered bus bars from contact (i.e., electrical insulation and a mechanical barrier) with external conductive elements, such as screws falling from above.

Figure 1:
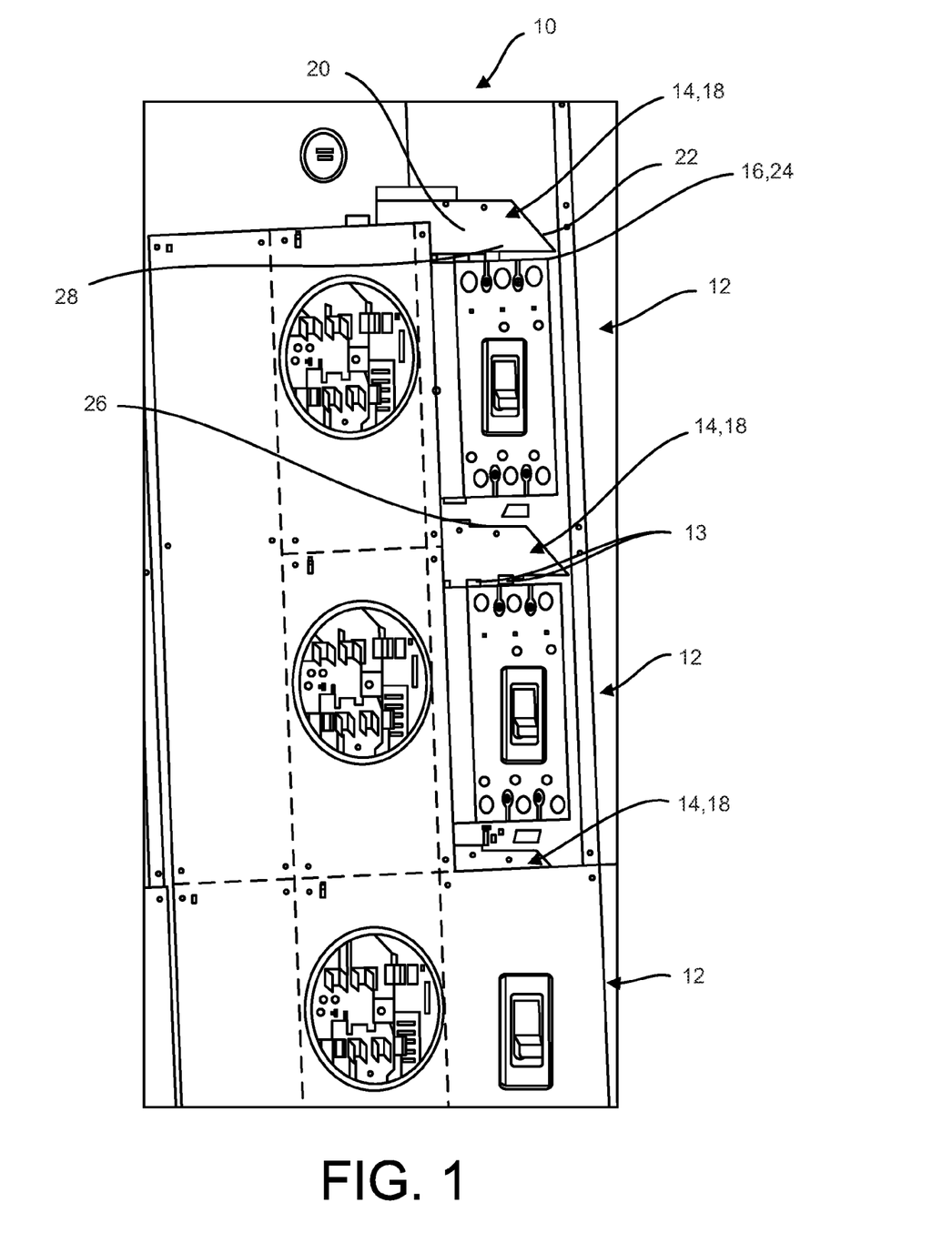
FIG. 1 is a front perspective view of a plurality of electrical protection slides mounted on vertically aligned and spaced apart electrical breakers in accordance with an embodiment.

Referring now to the drawings, and more particularly to FIG. 1, there is shown an electrical meter center 10, which receives a plurality of vertically aligned and spaced apart electrical breakers 12 (with line and load sides powered plated bus bars 13) in accordance with an embodiment. The plurality of vertically aligned and spaced apart electrical breakers 12 are powered by plurality of electrical phases (three phases shown in FIG. 1, which are phase A, phase B and phase C). FIG. 1 further shows two electrical protection slides 14 each mounted on each electrical breaker 12 of the electrical meter center 10. An electrical breaker 12 (with line and load sides powered plated bus bars 13) defines an upper surface to be protected against falling elements. Each electrical protection slide 14 includes a slope portion 18. Each electrical protection slide 14 is mounted on the upper surface 16 of the electrical breaker 12 (on the load side). The purpose of the slope portion 18 of the electrical protection slide 14 is to protect the upper surface 16 of the electrical breaker 12, and thus the upper surface of the bus bars 13 (load side), from contact with external conductive elements (not shown), such as screws falling from above, and further functionally to redirect screws outside of the electrical meter center 10, so that they fall on the floor in front of the electrical meter center 10, where they are easily recoverable, instead of falling inside the enclosure defined by the electrical meter center 10, where it would be difficult, if not dangerous, to reach them afterwards and where there would be potential risks of short circuits.

It should be noted that even though the instant description refers to and shows electrical breakers or bus bars being protected by the electrical protection slide, any other type of electrically conductive components known to those skilled in the art of electrical meter centers can be protected by the electrical protection slide described herein. The scope of the description or the claims is therefore not limited to the protection of electrical breakers or bus bars.

The slope portion 18 may be made of an electrical insulation material. For example, the slope portion 18 may be made from a sheet of Formex™, or made of (or covered with) any other suitable material that can provide electrical insulation between the external conductive elements, such as the screws, and the upper surface 16 of the electrical breakers 12, and its powered bus bars 13 on the load side. According to another embodiment, the whole electrical protection slide 14 or the whole upper surface of the electrical protection slide 14 may be made of or covered with a suitable electrically insulating material. According to another embodiment, the electrical protection slide 14 has flame retardant properties; i.e., low flammability.

According to an embodiment, the Formex™ product which is used in the electrical protection slide is selected from the list comprising: 94BK, 125BK, GK-5BK, GK-10, GK-17, GK-30, GK-40, GK-62, Statex-10, Statex-18, and Statex-31 (more information available at the following web link: www.itwformex.com/DesktopModules/Bring2mind/ DMX/Downloa d.aspx?command=core_download& entryid=36&language=en-US&PortalId=0&TabId=104).

According to an embodiment, the properties of the electrical protection slide 14 comprise at least one of:

Thickness: between 0.005 inches and 0.125 inches;
Density—gm/cc (using test method ASTM-D792): 0.988;
Flammability (using test method UL 94): VTM-0 or V-0;
Static decay—seconds (using test method ASTM-D257): <2;
Surface resistivity—ohms/square (using test method ASTM-D257): $10^9$ to $10^9$, Volume resistivity—ohms-cm (using test method ASTM-D257): $3.97 \times 10^{15}$ or $146 \times 10^{15}$;

Dielectric breakdown—volts (using test method ASTM D-149): 13,125 to 62,500;

Dielectric strength—volts (using test method ASTM D-149): 500 to 2625;

Dielectric constant (using test method ASTM D-150): 2.3; and

Dissipation factor (using test method ASTM D-150): 0.0009 to 0.0019.

The electrical protection slide 14 may further include, for installation purposes, a mating portion for easily mating with the structure of the electrical meter center 10 surrounding the electrical breaker 12 or the electrical breaker 12 itself. According to an embodiment, the electrical protection slide 14 is mounted in the electrical meter center 10 without the use of any fastening components. According to an embodiment, the mating portion comprises an abutment face 40 (see FIG. 5) adapted for abutting against the frame of the electrical meter center 10.

It is to be mentioned that the electrical protection slide 14 may be mounted on the upper surface 16 of the electrical breaker 12 or bus bars 13 (load side) using any suitable arrangement. Therefore, the electrical protection slide 14 may be supported by the upper surface 16 of the electrical breaker 12 and/or bus bars 13, while being connected to its rear, front and/or sides surfaces. The electrical protection slide 14 may also be mounted to a portion of the structure to which is also mounted the electrical circuit breaker 12 (e.g., wall(s) of the electrical meter center 10).

According to an embodiment, the wherein at least the slope portion 18 is made of a substantially flexible material. Still according to another embodiment, the mating portion and the slope portion 18 are made from a single unitary piece of material. Furthermore, the electrical meter center may further comprise at least one of a backwall, a sidewall and a dividing wall. The mating portion is hence adapted for mounting to one of the electrical breaker, the backwall, the sidewall and the dividing wall.

The electrical protection slide 14, about the slope portion 18, includes an angled surface 20 for receiving the external element, such as a screw or other hardware including lock washers, washers, etc., falling from above, side surfaces 22, a rear surface (not shown) and/or a bottom surface (not shown). The angled surface 20 may be at an angle of from about 15° to about 65° relative to the horizon or a horizontal plane (e.g., the upper surface 16 of the electrical breaker 12 or bus bars 13) such that the external conductive element, such as the screw, will slide along the angled surface 20 by gravity (or bounce off the angled surface 20 toward outside the electrical meter center 10 and thus ending its path on the floor/ground surface (not shown)), without touching or interacting with the upper surface 16 of the electrical breaker 12 or of the powered tri-phased bus bar 13.

The upper surface 16 of the electrical breaker 12 defines an upper frontmost edge 24 and a rearmost edge (not shown). Moreover, the electrical protection slide 14 defines an uppermost edge 26 and a lowermost edge 28. Still referring to FIG. 1, there is shown that the lowermost edge 28 of the electrical protection slide 14 and the upper frontmost edge 24 of the upper surface 16 of the electrical breaker 12 are vertically aligned and interfacing with each other. It is to be mentioned that it would be possible to have the lowermost edge 28 of the electrical protection slide 14 vertically aligned with the upper frontmost edge 24 of the upper surface 16 of the electrical breaker 12, but vertically distant from the upper frontmost edge 24 of the upper surface 16, as long as an external conductive element, such as a screw, would slide along the angled surface 20 of the slope portion 18 by gravity without interfacing with the upper surface 16 of the electrical breaker 12.

Even if the angled surface 20 of the slope portion 18 is shown to include a flat and/or longitudinal surface (e.g., a substantially flat surface), it is to be mentioned that the angled surface 20 of the slope portion 18 may include any suitable surface configuration, again, as long as an external conductive element, such as a screw, is capable of sliding along the angled surface 20 of the slope portion 18 by gravity (or bounce off the slope portion 18 toward outside the electrical meter center 10, and thus ending its path on the floor/ground surface) without interfacing with the upper surface 16 of the electrical breaker 12. For example, the electrical protection slide 14 may include longitudinal projections (not shown), outwardly and upwardly extending from the angled surface 20 for directing external conductive elements, such as screws, toward the lowermost edge 28 of the electrical protection slide 14 and therefore, toward the floor/ground surface.

Figure 5:
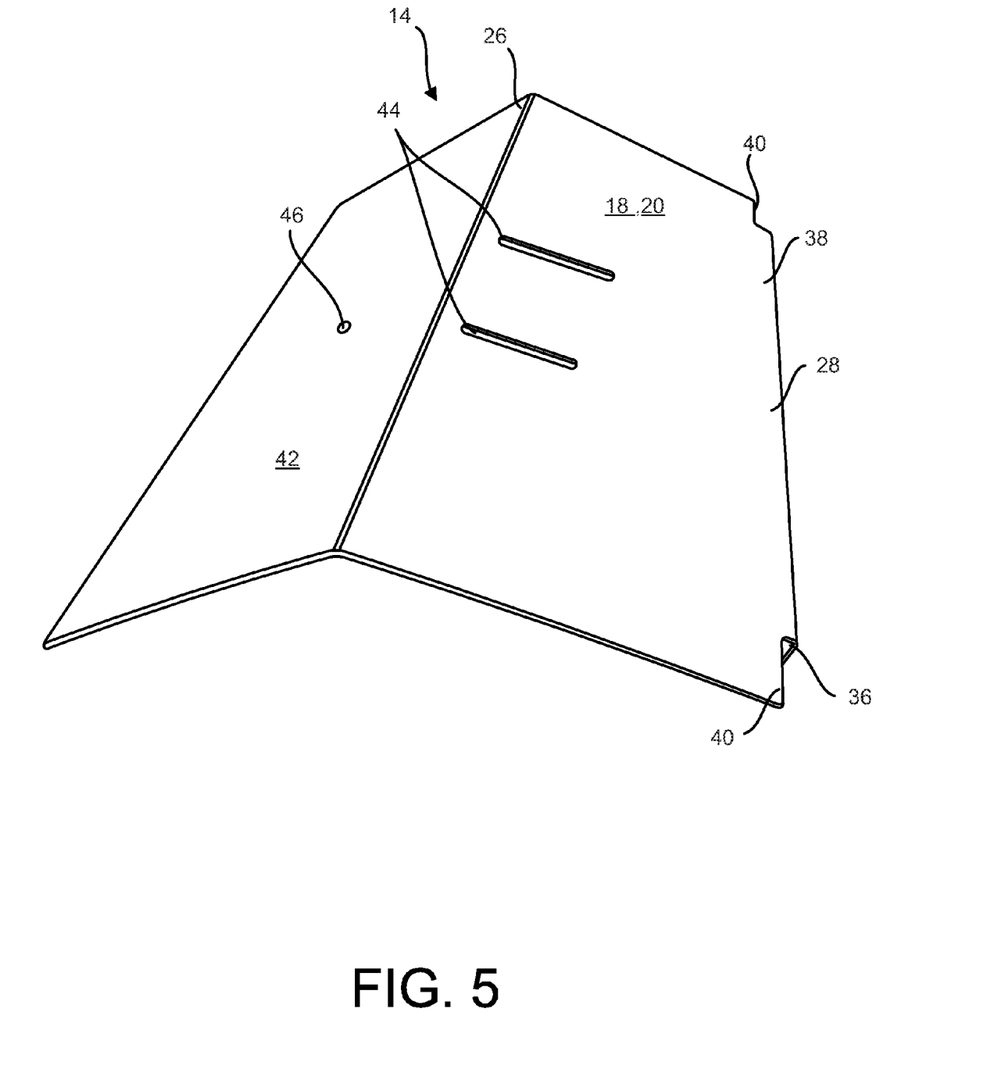
FIG. 5 is a top perspective view showing the protection slide before being mounted within the electrical meter center.

Referring to FIG. 5, there is shown a top perspective view of the electrical protection slide 14, unmounted in the electrical meter center. FIG. 5 shows the uppermost edge 26 along which is provided a fold in the electrical protection slide 14 between 18 slope portion 18 and a back surface 42. The slope portion 18, which provides an angled surface 20 once the electrical protection slide 14 is mounted over an electrical breaker, extends between the uppermost edge 26 and the lowermost edge 28 of the electrical protection slide 14.

As illustrated, the lowermost edge 28 further comprises an elongated projection 38 extending along part of the lowermost edge 28. The lowermost edge 28 also comprises a lip 36 extending downwardly from the elongated projection 38. The elongated projection 38 is adapted to extend toward the front between portions of the frame of the electrical meter center holding the electrical breaker. The two opposite ends 40 of the lowermost edge 28 define abutment faces abutting on these same portions of the frame which hold the electrical breaker.

A back surface 42 extends from the uppermost edge 26 substantially in a direction opposite the lowermost edge 28. The back surface 42 is intended to provide, among other things, a mounting function. The electrical protection slide 14 may further comprise slits 44 and hole 46 for mounting or assembling as described below.

Figure 6:
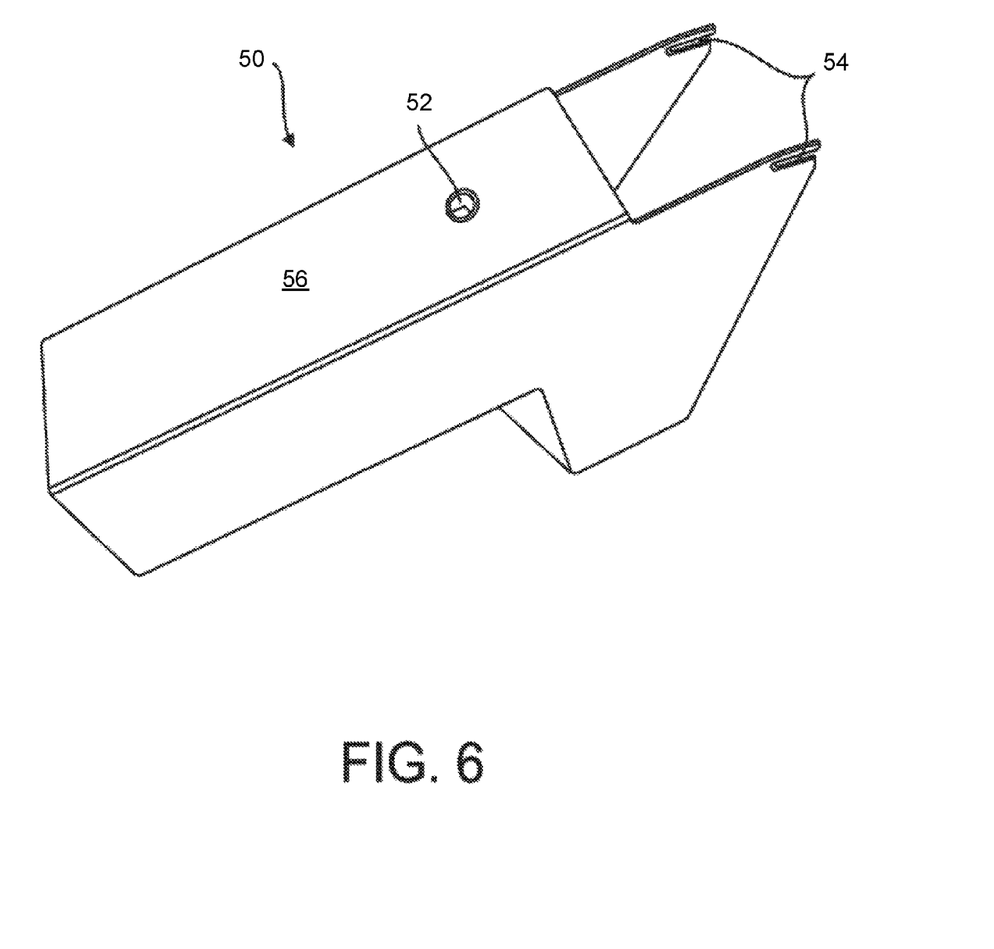
FIG. 6 is a top perspective view showing a bus insulator to be assembled with the protection slide according to an embodiment.

Referring to FIG. 6, a bus insulator 50 is shown for assembling with the electrical protection slide 14. The bus insulator 50, once mounted, will cooperate with the electrical protection slide 14 in insulating electrical plated bus bars from falling hardware such as screws or the like. The bus insulator 50 comprises a hole 52 and slots 54 respectively cooperating with hole 46 and with slits 44 of the electrical protection slide 14 (see FIG. 5). The bus insulator 50 further comprises a protective body 56 extending on three (3) perpendicular faces and thereby protecting the electrical bus bars (except for the underside thereof).

Figure 7:
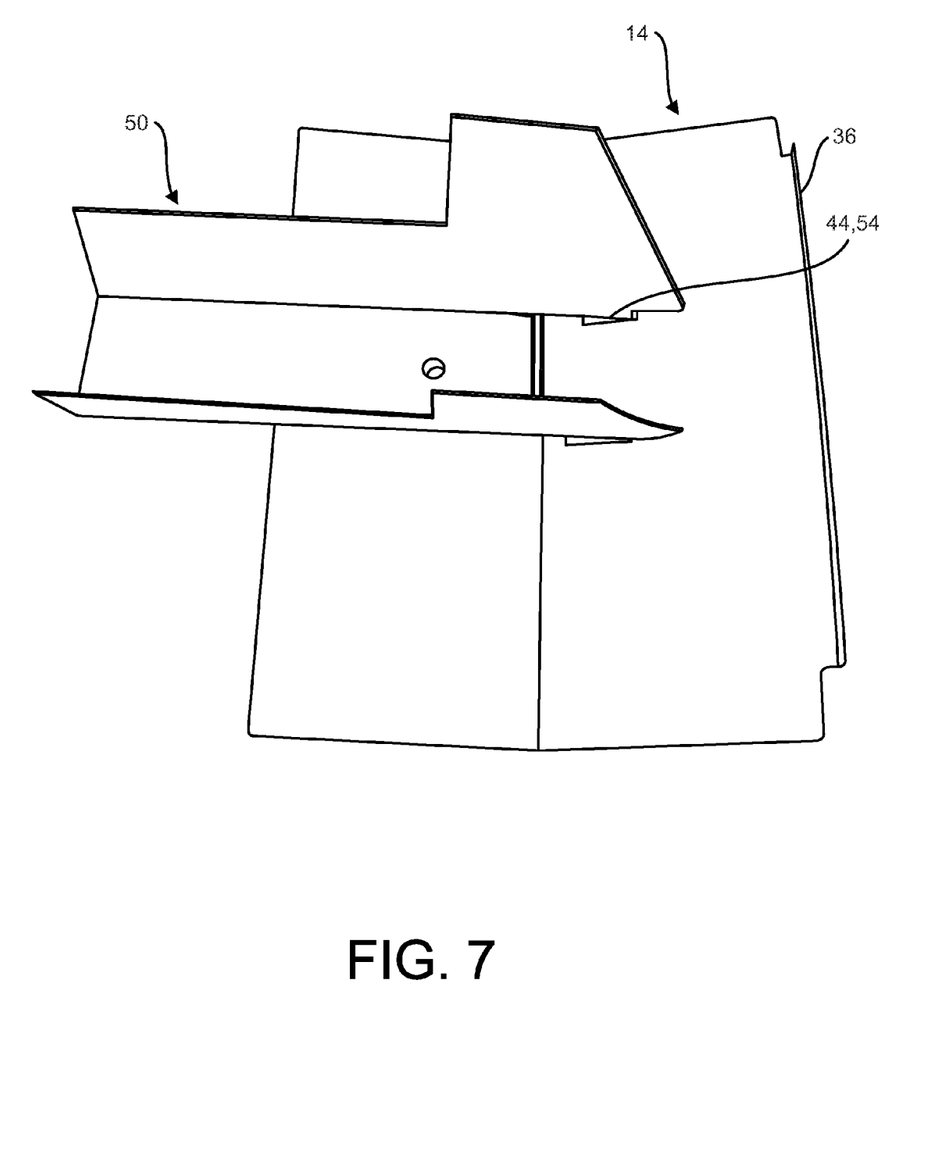
FIG. 7 is a bottom perspective view showing an assembly comprising the electrical protection slide and the bus insulator of FIGS. 5 and 6.

Referring to FIG. 7, a bottom perspective view shows the assembly of the electrical protection slide 14 and the bus insulator 50. There is shown lip 36 from the bottom and the cooperation of slits 44 and slots 54 in assembling the electrical protection slide 14 and the bus insulator 50.

Figure 8:
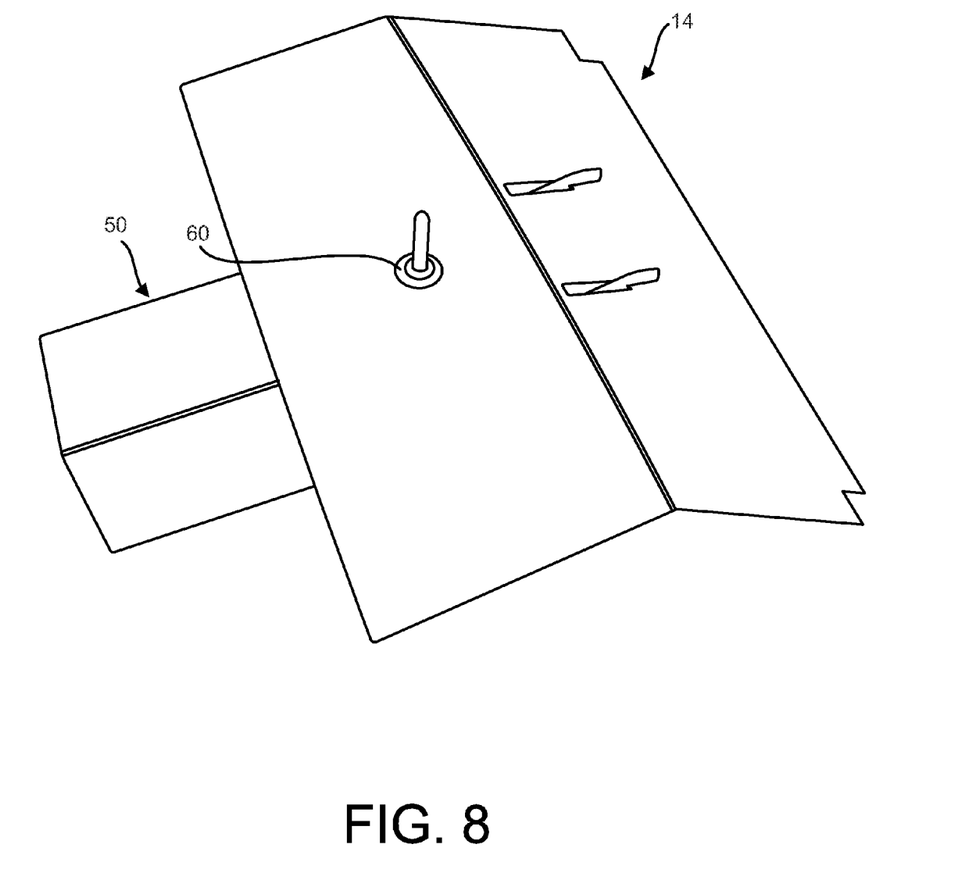
FIG. 8 is a top perspective view showing the assembly of FIG. 7.

Referring to FIG. 8, the top perspective view shows the assembly with a rivet assembly 60 being used to fasten, permanently or not, the electrical protection slide 14 on the bus insulator 50 through hole 52 (shown in FIG. 6) in the bus insulator 50 and hole 46 (shown in FIG. 5) in the electrical protection slide 14. It is understood that rivet assembly 60 is an example among other types of fasteners that could be used to fasten the bus insulator 50 to the electrical protection slide 14.

Figure 2:
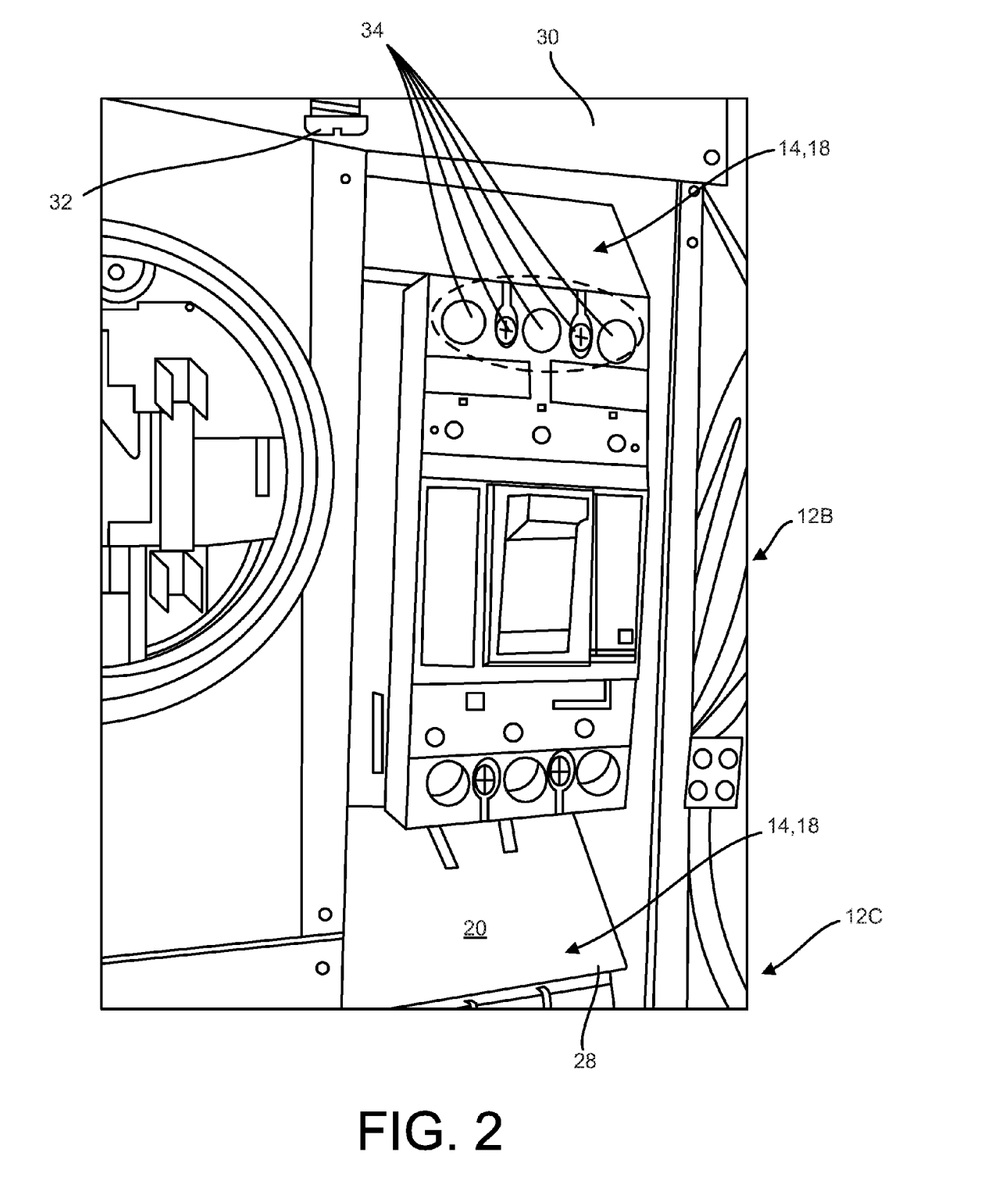
FIG. 2 is a front perspective view showing two electrical protection slides mounted on an electrical breaker in accordance with another embodiment.

According to another embodiment, and referring now to FIG. 2, there is shown a picture showing electrical protection slides 14 mounted on electrical breakers 12B, 12C. In operation, for maintenance and or new installation purposes, even if it is not recommended by electrical code, there is a risk that the customers, installers and/or repairmen will keep the electrical power of the entire electrical meter center 10 ON while installing a new electrical breaker. As for maintenance tasks, which are often performed with power ON, there is great improvement having regards to equipment and user protection against a screw short circuit between different polarities.

According to FIG. 2, the customer, installer and/or repairmen is fixing an electrical meter center wall panel 30 to cover a first electrical breaker (not shown). As shown, he is using a screw 32 (the external conductive element) to do so. Therefore, if the screw 32 escapes from his fingers and falls down toward the second electrical breaker 12B and/or the third electrical breaker 12C, which is/are respectively below and distant from the first electrical breaker (not shown), the screw 32, instead of falling on the three phase bus bar (i.e., the bus bar (not shown)) exiting from the top of the third electrical breaker 12C, will hit the angled surface 20 of the slope portion 18 of the electrical protection slide 14 mounted on the third electrical breaker 12C and slide/bounce off outside the electrical meter center 10, and thus end its path on the floor/ground surface. Accordingly, any screw falling down from about the screw zone 34 shown in FIG. 2 will hit the slope portion 18 instead of hitting either of the second electrical breaker 12B and the third electrical breaker 12C and then, slide/bounce off outside the electrical meter center 10, and thus end its path on the floor/ground surface.

Figure 3:
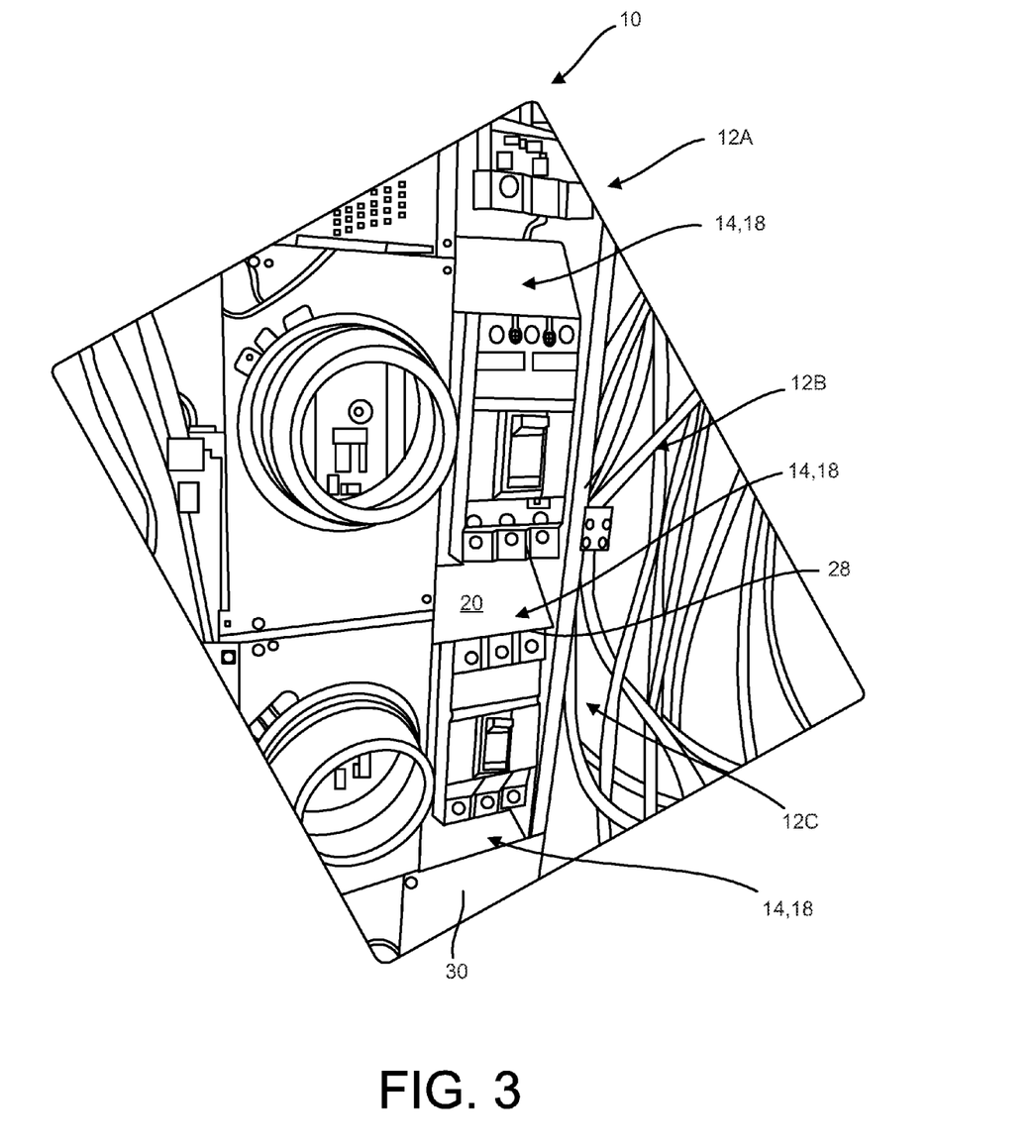
FIG. 3 is a front perspective view showing a plurality of electrical protection slides mounted on vertically aligned and spaced apart electrical breakers in accordance with a further embodiment.

According to FIG. 3, there is shown that an electrical protection slide 14 is mounted on a fourth electrical breaker (not shown), which is found below the first, second and third electrical breakers 12A, 12B, 12C. When a screw falls down toward the slope portion 18 mounted on the fourth electrical breaker (not shown), the screw will fall down and slide toward the lowermost edge 28 of the angled surface 20, for being stopped by the electrical meter center wall panel 30 that is covering the fourth electrical meter (not shown). It is then easy for the customer, installer and/or repairmen to recover his screw from the open space in front of the electrical meter center 10.

The electrical protection slide 14 described above provides efficiency to the customers, installers and/or repairmen (time efficient/cost efficient) since in case of emergency, the electrical power may not be shut down because of this protecting slide ensuring a certain level of security/protection against undesired and dangerous short circuits between phases and/or ground.

Figure 4:
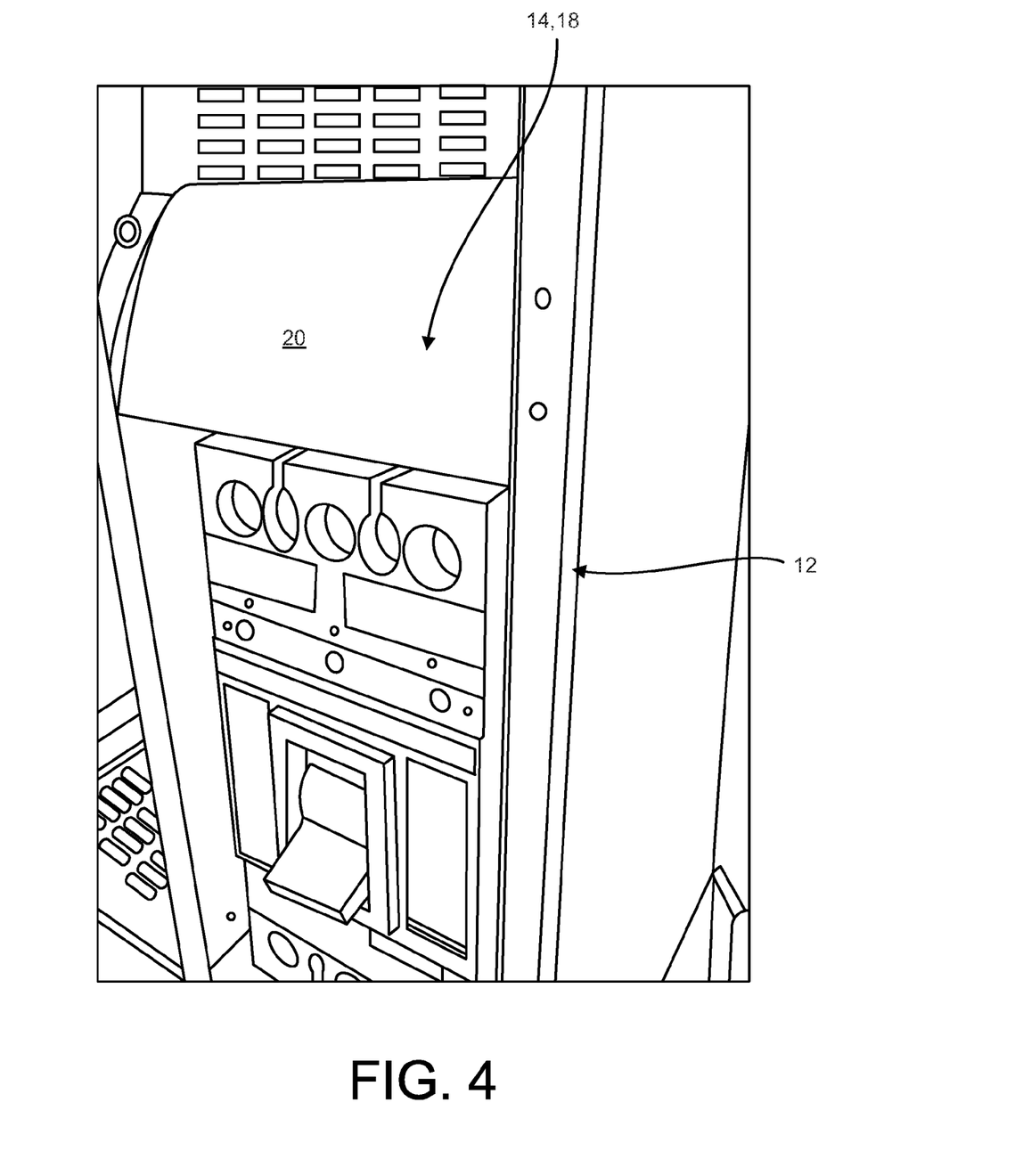
FIG. 4 is a front perspective view showing an electrical protection slide mounted on an electrical breaker in accordance with yet another embodiment.

FIG. 4 shows and electrical protection slide 14 with a slope portion 18 mounted on an electrical breaker 12 in accordance with another embodiment.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An electrical protection slide for mounting in an electrical meter center enclosing an electrically conductive component, wherein the electrically conductive component selected from a group consisting of an electrical breaker and a bus bar, the electrical meter center having a front, the electrical protection slide comprising:
   a slope portion configured to have a downward slope toward the front of the electrical meter center when the electrical protection slide is mounted in the electrical meter center; and
   a mating portion about the slope portion and being adapted for holding at least a portion of the slope portion within the electrical meter center above the electrically conductive component, when the electrical protection slide is mounted in the electrical meter center;
   wherein at least the slope portion of the electrical protection slide provides electrical insulation and a mechanical barrier for the electrically conductive component from external elements falling thereon.

2. The electrical protection slide of claim 1, wherein the slope portion defines a substantially flat surface.

3. The electrical protection slide of claim 1, wherein the slope portion defines an angle between 15 degrees and 65 degrees relative to a horizontal plane when mounted in the electrical meter center.

4. The electrical protection slide of claim 1, wherein the slope portion is made of or covered with an electrically insulating material.

5. The electrical protection slide of claim 1, wherein a thickness of the slope portion is between 0.005 inches and 0.125 inches.

6. The electrical protection slide of claim 1, wherein the mating portion further comprises an abutment face adapted for abutting against the electrical meter center, when the electrical protection slide is mounted in the electrical meter center.

7. The electrical protection slide of claim 1, wherein at least the slope portion is made of a flexible material.

8. The electrical protection slide of claim 1, further comprising a lip projecting downwardly from the slope portion.

9. The electrical protection slide of claim 1, further comprising a fold and a back surface extending from the slope portion along the fold.

10. The electrical protection slide of claim 9, wherein the mating portion, the back surface and the slope portion together comprise a single unitary piece of material.

11. An assembly adapted for mounting in an electrical meter center having a front and enclosing an electrical breaker, the assembly comprising:
    an electrical protection slide adapted for installation within the electrical meter center above the electrical breaker and comprising a slope portion configured to have a downward slope toward the front of the electrical meter center when the assembly is mounted in the electrical meter center, the electrical protection slide providing electrical insulation and a mechanical barrier for the electrical breaker from external elements falling thereon when the assembly is mounted in the electrical meter center.

12. The assembly of claim 11, further comprising a bus insulator comprising a protective body extending rearwardly from the slope portion, wherein the protective body provides the electrical insulation and the mechanical barrier for the electrical breaker from the external elements falling thereon when the assembly is mounted in the electrical meter center.

13. The assembly of claim 12, wherein the slope portion comprises a slit and the bus insulator comprises a slot cooperating with the slit for assembling the electrical protection slide to the bus insulator.

14. The assembly of claim 13, wherein the electrical protection slide further comprises a fold and a back surface extending from the slope portion along the fold.

15. The assembly of claim 14, wherein the back surface comprises a first hole and the bus insulator comprises a second hole, wherein the assembly further comprises a fastener cooperating with the second hole in the bus insulator and the first hole in the back surface to fasten the electrical protection slide to the bus insulator.

16. An electrical meter center having a front and comprising:
    an electrical breaker installed within the electrical meter center;
    an electrical protection slide installed within the electrical meter center above the electrical breaker and comprising a slope portion having a downward slope toward the front of the electrical meter center, the electrical protection slide providing electrical insulation and a mechanical barrier for the electrical breaker from external elements falling thereon.

17. The electrical meter center of claim 16, further comprising a frame, and wherein the electrical protection slide further comprises a mating portion adapted to cooperate with the frame to hold the electrical protection slide into position.

18. The electrical meter center of claim 16, further comprising an electrical bus bar connected to the electrical breaker, and wherein the electrical protection slide further comprises a bus insulator extending from the slope portion and providing the electrical insulation and the mechanical barrier for the electrical bus bar from the external elements falling thereon.

* * * * *